United States Patent
Wilson et al.

(10) Patent No.: US 7,166,491 B2
(45) Date of Patent: Jan. 23, 2007

(54) THERMOPLASTIC FLUXING UNDERFILL COMPOSITION AND METHOD

(75) Inventors: Mark Wilson, Cumming, GA (US); David Garrett, Marietta, GA (US)

(73) Assignee: Fry's Metals, Inc., Alpharetta, GA (US)

( * ) Notice: Subject to any disclaimer, the term of this patent is extended or adjusted under 35 U.S.C. 154(b) by 141 days.

(21) Appl. No.: 10/458,925

(22) Filed: Jun. 11, 2003

(65) Prior Publication Data

US 2004/0251561 A1 Dec. 16, 2004

(51) Int. Cl.
H01L 21/44 (2006.01)

(52) U.S. Cl. ...................................... 438/106

(58) Field of Classification Search ................ 438/108, 438/106; 528/310; 554/227
See application file for complete search history.

(56) References Cited

U.S. PATENT DOCUMENTS

| 4,212,816 | A | * | 7/1980 | Hentschel et al. .......... 554/227 |
| 5,128,746 | A | | 7/1992 | Pennisi et al. |
| 5,376,403 | A | | 12/1994 | Capote et al. |
| 5,543,585 | A | | 8/1996 | Booth et al. |
| 5,601,675 | A | | 2/1997 | Hoffmeyer et al. |
| 5,703,406 | A | | 12/1997 | Kang |
| 5,783,867 | A | | 7/1998 | Belke, Jr. et al. |
| 5,985,456 | A | | 11/1999 | Zhou et al. |
| 6,063,828 | A | | 5/2000 | Ma et al. |
| 6,100,114 | A | | 8/2000 | Milkovich et al. |
| 6,121,689 | A | | 9/2000 | Capote et al. |
| 6,168,972 | B1 | | 1/2001 | Wang et al. |
| 6,194,788 | B1 | | 2/2001 | Gilleo et al. |
| 6,228,678 | B1 | * | 5/2001 | Gilleo et al. ................ 438/108 |
| 6,228,681 | B1 | | 5/2001 | Gilleo et al. |
| 6,238,223 | B1 | | 5/2001 | Cobbley et al. |
| 6,274,650 | B1 | | 8/2001 | Cui |
| 6,297,560 | B1 | | 10/2001 | Capote et al. |
| 6,323,062 | B1 | | 11/2001 | Gilleo et al. |
| 6,350,841 | B1 | | 2/2002 | Schultz et al. |
| 6,358,354 | B1 | | 3/2002 | Patil |
| 6,380,322 | B1 | | 4/2002 | Wong et al. |
| 6,395,124 | B1 | | 5/2002 | Oxman et al. |
| 6,399,178 | B1 | | 6/2002 | Chung |
| 6,399,426 | B1 | | 6/2002 | Capote et al. |
| 6,767,987 | B2 | * | 7/2004 | Okazaki ..................... 528/310 |
| 2001/0000929 | A1 | | 5/2001 | Gilleo |
| 2001/0003058 | A1 | | 6/2001 | Gilleo et al. |
| 2001/0017414 | A1 | | 8/2001 | Gilleo |
| 2002/0014703 | A1 | | 2/2002 | Capote et al. |
| 2002/0019075 | A1 | | 2/2002 | Brand |
| 2002/0020491 | A1 | | 2/2002 | Price et al. |
| 2002/0025602 | A1 | | 2/2002 | Jiang et al. |
| 2002/0031868 | A1 | | 3/2002 | Capote et al. |

FOREIGN PATENT DOCUMENTS

WO    WO 99/04430    1/1999

* cited by examiner

*Primary Examiner*—Carl Whitehead, Jr.
*Assistant Examiner*—Monica D. Harrison
(74) *Attorney, Agent, or Firm*—Senniger Powers

(57) ABSTRACT

A flip chip having solder bumps and an underfill that is thermoplastic and fluxing, as well as methods for making such a device. The resulting device is well suited for a simple one-step application to a printed circuit board, thereby simplifying flip chip manufacturing processes.

43 Claims, 1 Drawing Sheet

THERMOPLASTIC FLUXING UNDERFILL COMPOSITION AND METHOD

BACKGROUND OF THE INVENTION

The present invention relates to a flip chip design. More particularly, the present invention relates to a flip chip design which incorporates solder bumps and a polymeric underfill material that is thermoplastic and provides fluxing during a solder reflow operation.

Electrical components such as resisters, capacitors, inductors, transistors, integrated circuits, and chip carriers are typically mounted on circuit boards according to one of two configurations. In the first configuration, the components are mounted on one side of the board and leads from the components extend through holes in the board and are soldered on the opposite side of the board. In the second configuration, the components are soldered to the same side of the board upon which they are mounted. These latter devices are said to be "surface-mounted."

Surface mounting of electronic components is a desirable technique in that it may be used to fabricate very small circuit structures and in that it lends itself well to process automation. A type of surface-mounted device, referred to as a flip chip, Chip Scale Package, or Ball Grid Array comprises an integrated circuit having numerous connecting leads attached to pads mounted on the underside of the device. These surface-mounted devices are often referred to as Area Array Packages. In connection with the use of flip chips, either the circuit board or the device is provided with small bumps or balls of solder (hereinafter "bumps" or "solder bumps") positioned in locations which correspond to the pads on the underside of each device and on the surface of the circuit board. The device is mounted by (a) placing it in contact with the board such that the solder bumps become sandwiched between the pads on the board and the corresponding pads on the device; (b) heating the assembly to a point at which the solder is caused to reflow (i.e., melt); and (c) cooling the assembly. Upon cooling, the solder hardens, thereby mounting the area array device to the board's surface. Tolerances in area array technology are critical, as the spacing between individual devices as well as the spacing between the chip and the board is typically very small. For example, spacing of flip chips from the surface of the board to the bottom of the die is typically between about 15 and about 75 μm and is expected to approach about 10 μm in the near future.

One problem associated with area array technology is that the chips, the solder, and the material forming the circuit board often have significantly different coefficients of thermal expansion. As a result of the differing expansions, the heating of the assembly during use can cause severe stresses. The stresses imposed on the solder interconnects can lead to failures that degrade device performance or incapacitate the device entirely.

In order to minimize thermomechanical fatigue resulting from different thermal expansions, thermoset epoxies have been used. Specifically, these epoxies are used as an underfill material which surrounds the periphery of the area array device and occupies the space beneath the chip between the underside of the chip and the board which is not occupied by solder. Such epoxy systems provide a level of protection by forming a physical barrier which resists or reduces different expansions among the components of the device.

Improved underfill materials have been developed in which the epoxy thermoset material is provided with a silica powder filler. By varying the amount of filler material, it is possible to cause the coefficient of thermal expansion of the filled epoxy thermoset to more closely match that of the integrated circuit and printed circuit board substrates. In so doing, relative movement between the underside of the flip chip and the solder connections, resulting from their differing coefficients of thermal expansion, is minimized. Such filled epoxy thermosets therefore reduce the likelihood of device failure resulting from thermomechanical fatigue during operation of the device.

While underfill has solved the thermal mismatch problem for area array devices on printed circuit boards, it has created significant difficulties in the manufacturing process. For example, the underfill must be applied off-line using special equipment. Typically, the underfill is applied to up to three edges of the assembled flip chip and allowed to flow all the way under the chip. Once the material has flowed to opposite edges and all air has been displaced from under the chip, additional underfill is dispensed to the outer edges so as to form a fillet making all four edges symmetrical. This improves reliability and appearance. Next, the assembly is baked in an oven to harden the underfill. This process, which may take up to several hours, is necessary to harden and fully cure the underfill. Thus, although the underfill couples the area array device to the substrate replacing shear stresses with bending stresses, and provides a commercially viable solution, a simpler manufacturing method is desirable.

Recently, attempts have been made to improve and streamline the underfill process. One method that has shown some commercial potential involves dispensing underfill before assembling the area array device to the substrate and making solder connections. This method requires that the underfill allow solder joint formation to occur. Soldering of flip chips to printed circuit boards is generally accomplished by applying flux to the solder bumps on the flip chip or to the circuit pads on the printed circuit board. Thus, the flux must be applied to the bumps before the underfill or the underfill must contain flux or have inherent properties that facilitate solder joint formation. Flux activity is needed to remove the oxidation on the pads for the solder to wet the pad metalization forming acceptable interconnects.

Certain underfills commonly called "dispense first underfills" or no flow underfills have been designed with self-contained flux chemistry. Unfortunately, the properties required for a good flux and those required for a good underfill are not totally compatible. As such, a compromise of properties results. The best flux/underfill materials typically require more than an hour to harden. Additionally, flux-containing underfills still require the use of special equipment including automated dispensing machines.

Also, since solder assembly and underfill application are combined into a single step, the flip chip cannot be tested until the assembly is complete. Thus, if the chip does not operate satisfactorily, it cannot be removed because the underfill will have hardened, thereby preventing reworking.

In view of the above, a need still exists for a more efficient process which reduces the need for expensive equipment and that is compatible with existing electronic device assembly lines. A need for a reworkable underfill also exists. A further need exists for a flux/underfill material that can harden quickly while offering both excellent fluxing properties and excellent underfill properties.

SUMMARY OF THE INVENTION

Briefly, therefore, the present invention is directed to a method for forming an integrated circuit assembly for attachment to a circuit board by soldering. The method comprises applying an underfill solution comprising a thermoplastic resin having a glass transition temperature that is within the range of about −25° C. to about 60° C., a solvent, and a fluxing agent to an integrated circuit device having at least one solder bump on a surface thereof such that the underfill solution is in contact with the at least one solder bump and with the surface of the integrated circuit device. Then, at least a portion of the solvent is removed from the applied underfill solution to thereby yield the integrated circuit assembly for attachment to a circuit board, wherein the integrated circuit assembly comprises the integrated circuit device, the at least one solder bump, and a thermoplastic fluxing underfill in contact with the integrated circuit device surface and in contact with the at least one solder bump.

The present invention is also directed to a method for forming an integrated circuit assembly for attachment to a circuit board by soldering. The method comprises applying an underfill solution comprising a thermoplastic resin having a glass transition temperature that is within the range of about −25° C. to about 60° C., a solvent, and a fluxing agent to an integrated circuit device having at least one solder bump on a surface thereof such that the underfill solution is in contact with the at least one solder bump and with the surface of the integrated circuit device. Then, the solvent is removed from the applied underfill solution to thereby yield the integrated circuit assembly for attachment to a circuit board, wherein the integrated circuit assembly comprises the integrated circuit device, the at least one solder bump, and a thermoplastic fluxing underfill in contact with the integrated circuit device surface and in contact with the at least one solder bump.

Additionally, the present invention is directed to a method for forming an integrated circuit assembly for attachment to a circuit board by soldering comprising applying an a underfill solution comprising a thermoplastic resin, a solvent, and a fluxing agent to an integrated circuit device having at least one solder bump on a surface thereof such that the underfill solution is in contact with the at least one solder bump and with the surface of the integrated circuit device. Then at least a portion of the solvent is removed from the applied underfill solution to thereby yield the integrated circuit assembly for attachment to a circuit board, wherein the integrated circuit assembly comprises the integrated circuit device, the at least one solder bump, and a cured thermoplastic fluxing underfill in contact with the integrated circuit device surface and in contact with the at least one solder bump.

Further, the present invention is directed to a method for forming an integrated circuit assembly for attachment to a circuit board by soldering comprising applying a cured underfill film comprising a thermoplastic resin and a fluxing agent to an integrated circuit device having at least one solder bump on a surface thereof such that the cured underfill film is in contact with the at least one solder bump and with the surface of the integrated circuit device. The method also comprises adhering the cured underfill film to the integrated circuit device to yield the integrated circuit assembly for attachment to a circuit board, wherein the integrated circuit assembly comprises the integrated circuit device, the at least one solder bump, and the cured thermoplastic fluxing underfill adhered to the integrated circuit device surface and the at least one solder bump.

The present invention is also directed to a method for attaching an integrated circuit device to a circuit board by soldering. The method comprises applying an underfill solution comprising a thermoplastic resin having a glass transition temperature that is within the range of about −25° C. to about 60° C., a solvent, and a fluxing agent to an integrated circuit device having at least one solder bump on a surface thereof such that the underfill solution is in contact with the at least one solder bump and with the surface of the integrated circuit device. The applied underfill solution is dried to yield the integrated circuit assembly for attachment to a circuit board, wherein the integrated circuit assembly comprises the integrated circuit device, the at least one solder bump, and a thermoplastic fluxing underfill in contact with the integrated circuit device surface and in contact with the at least one solder bump. The integrated circuit assembly is placed onto the circuit board to yield a circuit board with the integrated circuit assembly placed thereon. The circuit board with the integrated circuit assembly placed thereon is heated to a reflow temperature to thereby solder the integrated circuit device to the circuit board while the fluxing agent fluxes the solder and to flow the thermoplastic fluxing underfill thereby yielding a circuit board having the integrated circuit device attached thereto with a metallic solder connection and the thermoplastic underfill between and bonded to the circuit board and the integrated circuit device.

Additionally, the present invention is directed to a method for attaching an integrated circuit device to a circuit board by soldering. The method comprises applying an underfill solution comprising a thermoplastic resin, a solvent, and a fluxing agent to an integrated circuit device having at least one solder bump on a surface thereof such that the underfill solution is in contact with the at least one solder bump and with the surface of the integrated circuit device. The applied underfill solution is dried to yield the integrated circuit assembly for attachment to a circuit board, wherein the integrated circuit assembly comprises the integrated circuit device, the at least one solder bump, and a cured thermoplastic fluxing underfill in contact with the integrated circuit device surface and in contact with the at least one solder bump. The integrated circuit assembly is placed onto the circuit board to yield a circuit board with the integrated circuit assembly placed thereon. The the circuit board with the integrated circuit assembly placed thereon is heated to a reflow temperature to thereby solder the integrated circuit device to the circuit board while the fluxing agent fluxes the solder and to flow the cured thermoplastic fluxing underfill thereby yielding a circuit board having the integrated circuit device attached thereto with a metallic solder connection and the cured thermoplastic underfill between and bonded to the circuit board and the integrated circuit device.

Further, the present invention is directed to a method for attaching an integrated circuit device to a circuit board by soldering comprising placing an integrated circuit assembly comprising an integrated circuit device having at least one solder bump on a surface and a cured thermoplastic fluxing underfill in contact with said surface and in contact with the at least one solder bump onto the circuit board to yield a circuit board with the integrated circuit assembly placed thereon. The method also comprises heating the circuit board with the integrated circuit assembly placed thereon to a reflow temperature to thereby solder the integrated circuit device to the circuit board while the cured thermoplastic fluxing underfill flows and fluxes the solder thereby yielding a circuit board having the integrated circuit device attached thereto with a metallic solder connection and the cured thermoplastic underfill between and bonded to the circuit board and the integrated circuit device.

The present invention is also directed to a thermoplastic fluxing underfill solution for application between an integrated circuit device and a circuit board to assist in solder assembly of the integrated circuit device to the circuit board and to provide shock resistance after said solder assembly of the integrated circuit device to the circuit board. The thermoplastic fluxing underfill solution comprises a thermoplastic resin having a glass transition temperature within the range of about −25° C. to about 60° C., and thermal stability such that the thermoplastic resin loses less than about 10% of its weight upon exposure to soldering conditions comprising a temperature of about 250° C. for about 90 seconds. The solution also comprises a solvent which dissolves the thermoplastic resin having said thermal stability and a fluxing agent for fluxing a solder in solder assembly of the integrated circuit device to the circuit board.

The foregoing and other features and advantages of the present invention will become more apparent from the following description and accompanying figures.

DETAILED DESCRIPTION OF THE INVENTION

Figure 1:
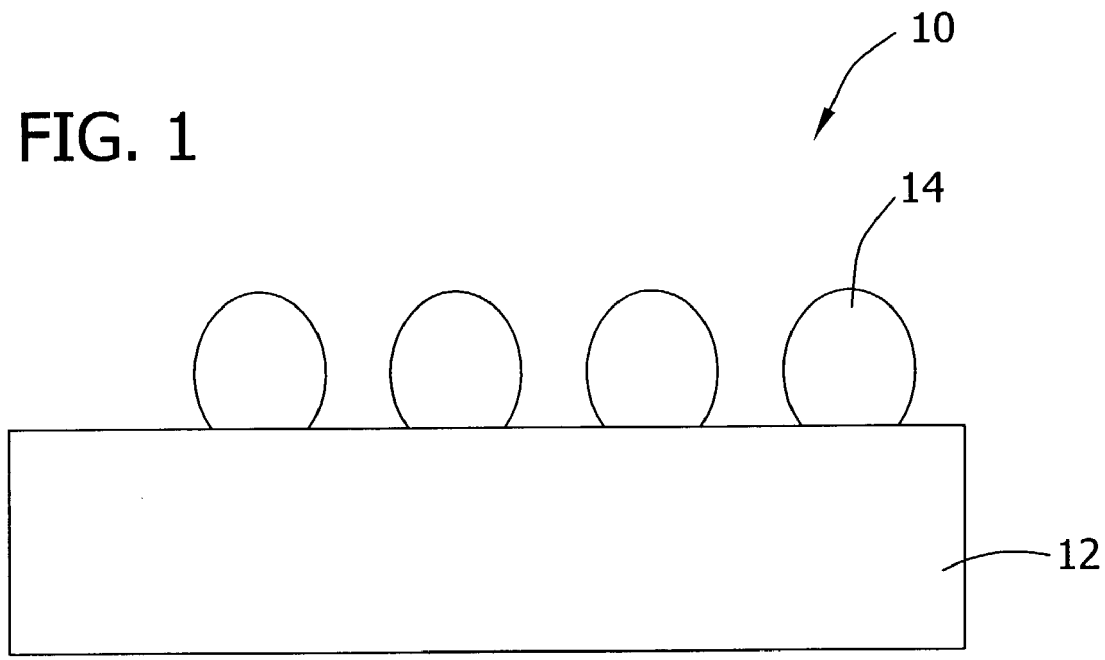
FIG. 1 is a schematic representation of a portion of a semiconductor wafer having solder bumps applied to its surface.

The present invention is directed to a thermoplastic fluxing underfill for use during and after solder reflow operations. Advantageously, the thermoplastic fluxing underfill of the present invention is a "no-flow" type underfill and may be pre-applied to a chip and/or substrate several months (e.g., at least six months) prior to the solder reflow operation without any decrease in the flow, adhesion, and/or reworkability. Additionally, the thermoplastic fluxing underfill of the present invention may be used with lead-containing and lead-free solders. Due to these and other characteristics, the present invention is also directed to a unique method of forming an integrated circuit assembly comprising an integrated circuit device (e.g., a flip chip) and the thermoplastic fluxing underfill that is ready for end user application (e.g., solder reflow connection onto a printed circuit board).

In general the present invention is directed to joining any appropriate electrical component to any appropriate printed circuit board. In accordance with the present invention, any appropriate type electrical component may, for example, comprise one or more of the following: an integrated circuit device (e.g., a flip chip), a resistor, a capacitor, an inductor, a transistor, or an area array device). It is to be noted that hereinafter this disclosure will be directed primarily to the joining of an integrated circuit device to a printed circuit board. This, however, is not to be interpreted as limiting the scope of the invention.

Appropriate substrate materials for a printed circuit board and/or an integrated circuit device include, for example, high-pressure laminates (i.e., layers of fibrous materials bonded together under heat and pressure with a thermosetting resin). In general, a laminate layer comprises an electrical-grade paper bonded with phenolic or epoxy resin or a continuous-filament glass cloth bonded with an epoxy-resin system. Specific examples of laminate layers are: XXXPC which is an electrical paper impregnated with phenolic resin; FR-2 which is similar to XXXPC with a flame retardant property; FR-3 which is a self-extinguishing laminate of electrical paper and epoxy resin; G-10 which is a laminate of glass cloth sheets and epoxy resin; FR-4 which is a self-extinguishing laminate similar to G-10; G-11 which is a glass cloth and epoxy mixture; FR-5 which is a flame-resistant version of G-11. In one embodiment of the present invention, the organic circuit board material is an FR-4 laminate layer that is placed on top of, and in intimate contact with the passive component pattern, and the two are laminated together. In addition to laminated organic materials, the substrate to which the integrated circuit is bonded may comprise, for example, a semiconductor material such as silicon or gallium arsenide, or an inorganic oxide such as alumina, titania, or zirconia.

The selection of the solder for joining the integrated circuit device and the printed circuit board depends upon several factors. For example, the solder should be compatible with the metal or metals used to form the leads of the integrated circuit device and the printed circuit board (i.e., upon removal of oxides from said metals by the fluxing agent the solder wets the leads during reflow to form an electrically conductive bond). Additionally, the selection of the solder may depend upon environmental and/or worker safety concerns. For example, there is an ever increasing demand for lead-free solders. Still further, the solder alloy preferably melts at a sufficiently low temperature so that there is no degradation of the integrated circuit device or the printed circuit board. Also, the solder preferably melts at a temperature at which the thermoplastic fluxing underfill is stable. For example, in one embodiment the solder melts at a temperature that is less than about 300° C. In another embodiment the solder melts at a temperature between about 180° C. and about 260° C. In yet another embodiment the solder melts at a temperature between about 220° C. and about 260° C. Further, when performing a reflow operation, the reflow temperature is typically about 10° C. to about 40° C. higher than the solder alloy melt temperature. For example, when reflowing a solder alloy having a relatively high melting temperature, for example, a melting point that is between about 210° C. and about 240° C., a reflow temperature that is between 220° C. about 260° C. is typically preferred. When reflowing a solder alloy having a relatively low melting temperature, for example, a melting point that is between about 160° C. and about 190° C., a relatively low reflow temperature that is between about 170° C. and about 225° C. is generally preferred.

In view of the foregoing, the thermoplastic fluxing underfill of the present invention may be used with any conventional leaded solders (e.g., $Sn_{63}Pb_{37}$ and $Sn_{62}Pb_{36}Ag_2$). However, it is particularly useful with solder alloys that are substantially free of lead which are commonly referred to as Pb-free solder alloys and typically contain less than about 0.3 wt % of lead. Pb-free solder alloys tend to have higher liquidus temperatures and/or reflow durations than lead-containing solder alloys. Exemplary Pb-free solder alloys include: $Au_{80}Sn_{20}$, $Sn_{96.2}Ag_{2.5}Cu_{0.8}Sb_{0.5}$, $Sn_{65}Ag_{25}Sb_{10}$, $Sn_{96.5}Ag_{3.5}$, $Sn_{95.5}Ag_{3.8}Cu_{0.7}$, $Sn_{96.5}Ag_3Cu_{0.5}$, $Sn_{95.5}Ag_4Cu_{0.5}$, $Sn_{93.6}Ag_{4.7}Cu_{1.7}$, $Sn_{42}Bi_{58}$, $Sn_{90}Bi_{9.5}Cu_{0.5}$, $Sn_{99.3}Cu_{0.7}$, $Sn_{99}Cu_1$, $Sn_{97}Cu_3$, $Sn_{87.1}In_{10.5}Ag_2Sb_{0.4}$, $Sn_{77.2}In_{20}Ag_{2.8}$, $Sn_{63.6}In_{8.8}Zn_{27.6}$, $Sn_{97}Sb_3$ and $Sn_{95}Sb_5$. The thermoplastic fluxing underfill of the present invention is particularly suited for fluxing any of the foregoing Pb-free solder alloys.

The solder alloy is typically applied as a solder paste which is a mixture of powdered solder metal alloy suspended or dispersed in a liquid vehicle. In general, at room temperature the solder paste is compliant enough so that it can be made to conform to virtually any shape. At the same time, it is "tacky" enough that it tends to adhere to any surface it is placed into contact with. These qualities make solder paste useful for forming solder bumps on electronic components such as ball grid array packages (BGAs) or on the board to attach BGAs. Typically, the solder paste is deposited by stenciling or screen printing. In one embodiment the solder paste is deposited onto the solder-wettable pads of the integrated circuit device. In another embodiment the solder paste is deposited onto the solder-wettable pads of the printed circuit board. In yet another embodiment solder paste is deposited on both the solder-wettable pads of the integrated circuit device and the printed circuit board.

The selection of the thermoplastic resin is based, in large part, on its thermal-related properties. For example, the thermoplastic resin preferably readily flows at reflow temperatures to minimize the occurrence of voids in the underfill and thereby maximize the bonding between the underfill, the integrated circuit device, and the printed circuit board. More specifically, in one embodiment of the present invention the viscosity of the thermoplastic resin at temperatures at or above the melting point of the solder alloy (e.g., between about 220° C. and about 260° C.) is less than about 30,000 cP. In another embodiment the viscosity of the thermoplastic resin is between about 10,000 and about 1,000 cP at a temperature between about 220° C. and about 260° C. In still another embodiment the viscosity of the thermoplastic resin is between about 3,000 and about 300 cP at a temperature between about 180° C. and about 240° C.

Additionally, the thermoplastic resin is selected to have sufficient tack to hold the integrated circuit device to the printed circuit board when mounting the integrated circuit device using, for example, a pick and place machine available from, e.g., Assemblion or Siemens. Specifically, in one embodiment the thermoplastic resin has sufficient tack for mounting the integrated circuit device upon being heated to between about 80° C. and about 125° C. As such temperatures, the viscosity of the thermoplastic resin is between about 2,500,000 and about 100,000 cP.

These thermal properties are, in large part, dependent upon the glass transition temperature (Tg) and the melt temperature (Tm) of the thermoplastic resin. The glass transition temperature is the temperature at which the polymer transforms from being solid-like and exhibiting an elastic deformation profile to being rubber-like and exhibiting a viscous deformation profile. Additionally, the transformation at Tg is typically associated with a substantial increase in the coefficient of thermal expansion (CTE). The melt temperature of the polymer is the point at which significant dimensional deformation (e.g., between about 1 and about 5%) under a load of about 25 mN occurs during a static temperature ramp utilizing a thermomechanical analyzer. It has been discovered that thermoplastic resins having sufficient flowability at solder reflow temperatures, sufficient tack for mounting an integrated circuit device, and reworkability have a Tg that is between about −25° C. and about 60° C. A thermoplastic resin with a Tg lower than about −25° C. would most likely have too low of a viscosity at the maximum reflow temperature and flow out from an integrated circuit device during the reflow operation. In contrast, a thermoplastic resin with a Tg above about 60° C. would tend not to flow sufficiently to form the desired bond between the integrated circuit device and printed circuit board. It has also been discovered that appropriate thermoplastic resins typically have a Tm that is within the range of about 50° C. to about 150° C. In one embodiment of the present invention the thermoplastic resin has a Tg that is between about −15° C. about 40° C. and a Tm that is between about 60° C. and about 150° C. In yet another embodiment the thermoplastic resin has a Tg that is between about 20° C. and about 40° C. and a Tm that is between about 80° C. and about 100° C. In still another embodiment the thermoplastic resin has a Tg that is between about 25° C. and about 35° C. and a Tm that is between about 85° C. and about 95° C. In yet another embodiment the Tg is between about −5° C. and about 10° C. and the Tm is between about 50° C. and about 65° C.

In addition to temperature, the viscosity of the thermoplastic resin is related to the molecular weight of the polymer. In general, as the molecular weight of the polymer increases or decreases, so does the viscosity of the thermoplastic resin at a particular temperature. In one embodiment the molecular weight of the thermoplastic resin is between about 30,000 and about 55,000 daltons. In other embodiment the molecular weight of the thermoplastic resin is between about 30,000 and about 40,000 daltons. In yet another embodiment the molecular weight of the thermoplastic resin is between about 30,000 and about 36,000 daltons. In still another embodiment the molecular weight is between about 34,000 and about 42,000 daltons. In another embodiment the molecular weight of the thermoplastic resin is between about 42,000 and about 55,000 daltons.

The selection of the thermoplastic resin is also based on its thermal stability (i.e., its resistance to degradation at elevated temperatures). Stated another way, the selected thermoplastic resin is considered to be thermally stable (i.e., it does not substantially degrade during a reflow operation or a subsequent release/rework operation). The thermal stability of a thermoplastic resin may be quantified in terms of weight loss when heated to a particular temperature for a particular duration. With respect the present invention, a thermoplastic resin is considered to be thermally stable if the weight loss is less than about 10 percent when subjected to a thermogravimetric analysis comprising heating the resin to at least the maximum temperature at which the desired reflow operation occurs for at least the duration at which the maximum temperature is maintained. For example, in one embodiment the thermoplastic resin has less than about 5 percent weight loss when heated to about 250° C. for about 60 seconds and is considered to be thermally stable. In another embodiment the thermoplastic resin has less than a 10 percent weight loss when heated to about 300° C. for about 60 seconds and is considered to be thermally stable. Additionally, the thermoplastic resin is also preferably moisture resistant.

It has been discovered that thermoplastic resins having properties suitable for such a demanding application are phenoxy-based polymers of bisphenol A (i.e., they comprise polyhydroxyether). Other appropriate thermoplastic resins include polysulfone. One such commercially available phenoxy-based resin is INCHEMREZ PHENOXY PKCP-80 available from the InChem Corporation. This resin is a phenoxy resin having about 20 weight percent of caprolactone grafted onto the backbone hydroxyl groups. The INCHEMREZ PHENOXY PKCP-80 has a molecular weight of about 39,000 daltons and a glass transition temperature of about 30° C. by differential scanning calorimetry. The caprolactone decreases the viscosity of the thermoplastic resin. Additionally, the caprolactone tends to decrease the Tg of the phenoxy resin which without out the caprolactone would be about 90° C.

The PKCP-80 resin adequately flows at reflow temperatures. Specifically, the viscosity of the PKCP-80 resin is between about 7,000 and about 2,500 cP at a temperature between about 220° C. and about 260° C. Also, the PKCP-80 resin has sufficient tack for mounting an integrated circuit device. Specifically, the viscosity of the resin is between about 100,000 and about 500,000 cP at a temperature between about 80° C. and about 125° C. The PKCP-80 resin is also considered to be thermally stable. Specifically, upon being heated to a temperature of about 250° C. for about 90 seconds, the resin only loses about 2% of its weight. Further, upon being heated to a temperature of about 300° C. for about 90 seconds, the resin loses less than about 5% of its weight. With such thermal stability, the material is considered to not decompose during a solder reflow operation. The PKCP-80 also exhibits a low moisture uptake, specifically, less than about 5% when heated to about 130° C. while exposed to a 85% relative humidity atmosphere.

By utilizing a thermoplastic resin system (i.e., a polymer that softens when exposed to heat and returns to its original condition when cooled to room temperature), the underfill of the present invention is reworkable following the reflow operation. Thermoplastic resins typically comprise very little cross-linking of the polymer molecules which allows greater molecular mobility and hence the ability to soften when heated. In contrast, many conventional underfills comprise "thermoset" resins which are typically highly cross-linked polymers that cannot be softened after reflow which prevents removal or reworking of a faulty chip.

To form a layer of thermoplastic fluxing underfill, the thermoplastic resin is typically dissolved in an appropriate solvent or solvent blend. The particular solvent or solvents is not overly critical, but the solvent should readily dissolve the thermoplastic resin and be compatible with the components in the thermoplastic fluxing underfill. Preferably, the solvent also has evaporation and boiling points that are high enough so that it is considered easy and safe to handle yet low enough to allow removal of the solvent at room temperature or a drying oven (e.g., the evaporation point is preferably between about 70° C. and about 170° C. and the boiling point is preferably between about 90° C. and about 130° C.). Appropriate solvents include many polar solvents such as ketones (e.g., acetone, methyl ethyl ketone, methyl isobutyl ketone, cyclohexanone), esters (e.g., ethyl lactate, dibasic esters, ethylene glycol ethylether acetate, diethyleneglycol ethylether acetate, propyleneglycol methylether acetate, hexanediol diacrylate, phenoxy ethyl acrylate, ethoxyethyl propionate), alcohols (e.g., methanol, ethanol, isopropyl alcohol, benzyl alcohol, methylcellosolve, ethylcellosolve, 1-methoxy-2-propanol, carbitol and butylcarbitol), and combinations thereof. In one embodiment of the present invention the solvent is ethyl-ethoxypropionate and is commercially available from Eastman Chemical of Kingsport, Tenn.

The amount, or concentration, of thermoplastic resin dissolved in the solvent depends primarily upon the manner in which the thermoplastic fluxing underfill is to be applied to the integrated circuit device and/or printed circuit board. In general, the concentration of resin in solution is between about 20 and about 80 percent by weight of the thermoplastic fluxing underfill solution prior to application. However, the concentration may be outside the foregoing range and still be within the scope of the present invention. Depending upon the application method, the concentration of resin will tend to be toward the one end or the other of the range. For example, if the thermoplastic fluxing underfill is being deposited as a flowable liquid (e.g., it is being dispensed by needle and syringe) the concentration of resin is typically lower (e.g., between about 30 and about 45 weight percent of the thermoplastic fluxing underfill solution). Whereas, if the thermoplastic fluxing underfill is being cast into a film prior to being applied to the integrated circuit device, the concentration of resin in the solution tends to be higher (e.g., between about 40 and about 80 weight percent of the thermoplastic underfill solution). In one embodiment, the solution comprises about 40 weight percent of INCHEMREZ PHENOXY PKCP-80 dissolved in ethyl-ethoxypropionate and the solution is cast into a film.

The thermoplastic fluxing underfill of the present invention also comprises a fluxing component to remove oxides from all surfaces involved in the soldering operation (e.g., solder pads, solder bumps, and solder alloy powder). Further, the fluxing component also protects against oxidation during, and for a sufficient duration after, the reflow operation. Additionally, the flux and/or its residues preferably do not corrode the solder metal prior to, during, or following the soldering operation.

In addition, the fluxing component is preferably soluble or dispersable in the solvent and thermally stable at reflow temperatures. In general, the flux component comprises a carboxylic acid (e.g., mono-, di- and polycarboxylic acids). Carboxylic acids and dicarboxylic acids are preferred fluxing agents for many solder applications, however, many lower molecular weight acids decompose or evaporate at reflow temperatures. As such, the fluxing component preferably comprises higher molecular weight carboxylic and dicarboxylic acids. For example, carboxylic acids greater than C20 such as behenic acid, abietic acid, urocanic acid and dicarboxylic acids greater than C12 such as dodecanedioic acid and dodecanedicarboxyilic acid are preferred. Although they may be used, many of these materials are solid at room temperature and are not very soluble in polar solvents. Preferably, the fluxing agent is a liquid carboxylic acid such as isostearic acid, and/or DIACID 1550 from Westvaco. In one embodiment of the present invention the fluxing component comprises a liquid dicarboxylic acid sold under the trade name DIACID 1550 by Westvaco Chemicals of Charleston, S.C. The DIACID 1550 tends to be soluble in the appropriate solvents and has an appropriate thermal stability.

To form a completely fused and strong solder joint, the solder must adequately wet the solder pad and/or lead. Wetting depends in large part on the metallurgical reaction between solder and soldering surface, and on the efficacy of any fluxing component. Thus, if the fluxing component does not adequately remove oxides from the metals being joined during the reflow operation, the oxides retard or prohibit the reaction. Additionally, the joint will typically be incompletely fused, weak, and subject to forming a void in the solder joint. Without being held to a particular theory, it is presently believed that the mechanism behind void formation is the entrapment of excess flux or its vapors within the solder alloy. Thus, in addition to being thermally stable, the concentration of fluxing component in the thermoplastic fluxing underfill solution should be sufficient to reduce the metal oxides in the solder alloy and on the solderable surfaces, but not so great as to create voids. Typically, this is accomplished with a concentration of fluxing component that is between about 1 and about 10 weight percent of the thermoplastic fluxing underfill solution. In another embodiment the concentration of fluxing component is between about 4 and about 7 weight percent of the thermoplastic fluxing underfill solution. In yet another embodiment the concentration is about 4 weight percent of the thermoplastic fluxing underfill solution. In still another embodiment the concentration is about 2.5 weight percent of the thermoplastic fluxing underfill solution.

Although not required, other additives, such as wetting agents, defoaming agents, and coefficient of thermal expansion (CTE) modifiers may be added to the thermoplastic fluxing underfill. A wetting agent is typically added to improve the film forming properties of the underfill and/or to enhance the bonding of the underfill to the surfaces of the integrated circuit device and printed circuit board by decreasing the surface tension of the underfill. Appropriate wetting agents include the following classes of materials: modified silicone resins, fluorocarbons, and acrylic resins. The most commonly used type of wetting agent in underfills are silanes. In one embodiment the thermoplastic fluxing underfill comprises a commercially available silane-type wetting agent from Byk Chemie of Wesel, Germany sold under the trade name BYK 306. The BYK 306 wetting agent only contains 12 percent by weight wetting agent with the remainder being solvent. If present, the concentration of a wetting agent in the thermoplastic fluxing is typically kept near the minimum concentration at which effective wetting is accomplished because high concentrations can actually decrease adhesion. In general, the concentration of wetting agent in the underfill is between about 0.005 and about 2.0 weight percent of the solution. In one embodiment the concentration of wetting agent is between about 0.05 and about 0.20 weight percent of the thermoplastic fluxing underfill solution. In one embodiment the thermoplastic fluxing underfill comprises about 1 weight percent of BYK 306 which in terms of what is actually added to the thermoplastic fluxing underfill solution is about 0.12 weight percent of the wetting agent and about 0.88 weight percent of the associated solvent.

Defoaming agents are typically added prior to, or during, the mixing of the thermoplastic resin and solvent to assist in the degassing of the underfill solution. Stated another way, a defoaming agent tends to minimize the formation of pockets of entrapped air in the underfill solution. Such pockets of entrapped air tend to result in the formation of voids in the cured underfill which can degrade the adhesion and thermal stress compensation of the underfill. Appropriate defoaming agents include the classes of materials of polyether modified siloxanes and methylalkyl siloxanes. The most commonly used type of defoaming agent in underfills are modified polysiloxanes. Specific examples of underfill defoaming agents include BYK 525, BYK 530, and BYK 535 available from Byk Chemie of Wesel, Germany. In one embodiment the thermoplastic fluxing underfill comprises a commercially available modified polydimethylsiloxane-type defoaming agent from Crompton of Middlebury, Conn. sold under the trade name SAG 100. If present, the concentration of a defoaming agent in the thermoplastic fluxing is typically kept near the minimum concentration at which effective degassing is accomplished because high concentrations can decrease adhesion. In general, the concentration of defoaming agent is no greater than about 1 weight percent of the thermoplastic fluxing underfill solution. For example, in one embodiment the thermoplastic fluxing underfill comprises about 1 weight percent of SAG 100. In another embodiment the concentration of defoaming agent is between about 0.05 and about 0.5 weight percent of the solution. In yet another embodiment the concentration of defoaming agent is about 0.10 weight percent of the underfill solution.

A thermoplastic resin as set forth above typically has a coefficient of thermal expansion (CTE) that is between about 20 and about 70 ppm/° C. and acts to reduce the CTE mismatch between the solder and the substrate materials. To further reduce any CTE mismatch between the integrated circuit, the solder, and the circuit board, the thermoplastic fluxing underfill of the present invention may optionally comprise a coefficient of thermal expansion modifier component. The CTE modifying component has a CTE that is more compatible with the substrates (e.g., the flip chip and circuit board) thereby decreasing the thermal stress upon thermal cycling. The CTE modifying component is electrically insulating and has a CTE that is preferably less than about 10 ppm/° C. Exemplary CTE modifying component materials include beryllium oxide (about 8.8 ppm/° C.), aluminum oxide (about 6.5–7.0 ppm/° C.), aluminum nitride (about 4.2 ppm/° C.), silicon carbide (about 4.0 ppm/° C.), silicon dioxide (about 0.5 ppm/° C.), low expansion ceramic or glass powders (between about 1.0 to about 9.0 ppm/° C.), and mixtures thereof. In one embodiment of the present invention the CTE modifying component comprises silicon dioxide.

The maximum particle size of the CTE modifying component (i.e., the maximum cross-sectional distance of the particle) is preferably less than the height of the solder bumps to minimize any negative impact on solder joint integrity. Typically, the average particle size of the CTE modifying component is between about 3 and about 15 μm. Although the amount of the CTE modifying component in the thermoplastic fluxing underfill depends on the particular application, if present, the CTE modifying component typically comprises between about 10 and about 90 wt % of the thermoplastic fluxing underfill.

In general, the thermoplastic fluxing underfill solution is prepared by mixing together the various constituents. Typically, the preparation process comprises heating the solvent and thermoplastic resin to enhance the rate of dissolution. After dissolution of the resin in the solvent is complete, any remaining constituents such as wetting agents, defoaming agents, and CTE modifiers are typically dissolved or mixed into the solution.

As set forth above, the underfill solution may be formulated to have the correct rheology for the method of application. For example, because the ratio of solvent to solids is the primary factor in determining the viscosity of the solution, it is possible to formulate underfill solutions that can be applied using different methods. Additionally, because the solvent is substantially entirely evaporated after application of the underfill solution to the integrated circuit device wafer, the resulting, solid underfill layer will have the same composition regardless of the initial viscosity and percent solids of the underfill solution. This is because the solvent is merely a vehicle for carrying the solids during underfill application.

In one application method, the underfill solution is applied by spin coating. Spin coating is a common semiconductor processing method in which liquid is deposited onto a spinning wafer in order to provide a smooth and level coating. A typical viscosity for spin coating an underfill is between about 80 and about 85 Kcps, measured at 2.5 RPM using an RVT #6 spindle on a Brookfield viscometer. When applied to a wafer, a wafer spin rate of between about 700 and about 1500 RPM has been found to yield to uniform and smooth coating. Good application results have been found with a wafer spin rate of about 1200 RPM.

A second method for applying the thermoplastic fluxing underfill is stencil printing. This method typically requires a more viscous solution than that for spin coating. The thixotropic index, (i.e., change in viscosity as a result of mechanical shearing), can also be adjusted, using thixotropic additives, to improve printing characteristics. Specifically, the rheology of the solution is preferably gel-like or semi-solid if static, however, when a shear force is applied it preferably flows like a liquid. This allows for the underfill solution to flow through a stencil when a force is applied using a squeegee and to maintain the pattern of the stencil after the stencil is removed from the surface of the substrate. Exemplary thixotropic agents include fumed silicas. If present, the thixotropic agents typically comprise between about 0.2 and about 9 weight percent of the underfill solution. The thickness of the stencil determines the amount of material applied to the wafer and the stencil should be thicker than the bump height so that the blade applying the underfill material does not contact the bumps. If such contact does occur, damage to the bumps or even displacement of the bumps may occur.

The print method employs the use of a metal stencil and an automated stencil print machine such as those available from Speedline. In this method, the liquid underfill is deposited on the metal stencil which has an aperture slightly larger than the array, and a squeegee, either metal or rubber, is used to wipe the material over the aperture. The device to be underfilled is fitted in a tray (i.e., a JEDEC tray) or holding device with the array exposed in the stencil aperture. The material is deposited on the device via the wiping of the material over the aperture. The process parameters such as aperture height, collapse height, and percent solids of the thermoplastic composition are typically fine tuned to result in void free joint formation.

Other well known methods of depositing liquid underfill onto an integrated circuit device, wafer, or other substrate include spraying, screen printing, and needle deposition. Regardless of which manner the liquid underfill is applied, after being applied at least a portion of the solvent is evaporated from the underfill solution thereby increasing the viscosity of the underfill. Typically, the evaporation is enhanced by heating the underfill solution in an oven or by direct heating of the wafer. It has been found to be advantageous to heat the wafer while simultaneously using a forced hot air oven to help drive solvent out of the coating. Combined top and bottom heating can eliminate any tendency to trap solvent in the underfill layer by a process known as "skinning" in which the surface of the underfill material dries prematurely and forms a film (i.e., a skin) that acts as a barrier to further solvent evacuation. If drying is carried out properly, the resulting underfill material is non-tacky and amenable to handling. If a slight degree of tackiness at room temperature is desired, however, a tackifier may be added to the underfill.

It is generally preferred that the thickness of the dried underfill material be less than the height of the solder bumps to allow for collapse of the bumps during the reflow operation. In one embodiment, the thickness of the dried underfill layer is between about 50 and about 80 percent of the solder bump height. In another embodiment the thickness of the dried underfill layer is between about 60 and about 70 percent of the solder bump height. The amount of solvent contained in the underfill solution determines the amount of thickness reduction that occurs in the underfill during drying and solvent evacuation. Thus, in addition to stencil thickness, for example, the amount of solvent in the underfill solution and/or the deposit thickness may be controlled in order to control the thickness of the applied underfill. Typically, a dry underfill thickness range of about 25 to about 125 microns is suitable depending on the height of the solder bumps.

Alternatively, the underfill may be applied to the integrated circuit device as a solid underfill layer. Specifically, the underfill solution may be cast onto a release substrate (e.g., paper) and then dried into a film. The resulting film is then typically cut into a proper shape called a preform and applied to the integrated circuit device wafer (i.e., a wafer comprising a multiplicity of integrated circuit devices). Heating, with the application of pressure or a vacuum, is typically used to bond the underfill layer to the wafer. The temperature of the layer preferably is not increased above the point at which the fluxing properties of the underfill are activated (e.g., the temperature may be about 175° C.). Pulling a vacuum is generally preferred over applying pressure because it tends to be more effective at preventing air from being trapped between the film and the chip. One advantage of a solid film is that it can be easily shipped, conveniently stored, and applied by simple mechanical handling equipment. Like the underfill layers applied as a liquid to the integrated circuit, the film thickness should be less than the height of the solder bumps. In fact, the foregoing dry thickness range is equally applicable.

Unlike systems which employ a separate flux and underfill, the present system allows the underfill material to cover the solder bumps since it offers fluxing properties as well as underfill properties. In fact, it is preferred that the material cover the bumps because, in so doing, the bumps will be protected from oxidation, contamination, and mechanical damage. Each of the application methods described above has the capability of covering the bumps with the underfill material.

At this stage, the wafer is ready to be diced, or singulated, to produce individual area array devices (e.g., flip chips). Any of a wide variety of the methods known in the art for dicing wafers can be employed to that end. The sole requirement is that the process does not degrade the underfill material applied to the wafer/chip surface(s). In one embodiment dicing is achieved by attaching the wafer to a holding tape and then sectioning the wafer using, for example, a DISCO saw with a 5 μm diamond cutting blade operating at a speed of about 30,000 rpm. Water jet cooling is used to keep the temperature at the cut below the softening point of the film. The individual die or chip can then be picked off the tape and placed into waffle packs, tape and reel packaging, or other convenient die presentation systems used in the industry.

Once diced, individual area array devices may now be bonded to circuit boards and the like. Each area array device is placed and aligned to the bond pads of a substrate. As used herein, the term "substrate" is intended to mean a circuit board, a chip carrier, another semiconductor device, or a metal lead frame. It is not necessary to add flux, although flux may be added for special reasons such as compensating for excessive oxide on substrate pads, or the need to hold the flip chip in place during assembly (if the underfill is not tacky at room temperature or heated until tacky).

The area array device is then placed on the substrate using a pick and place machine. If the underfill is not tacky at room temperature, the substrate is preferably heated to a temperature within the range of about 80° C. to about 120° C. so that the thermoplastic has tack enough to hold the die in place. The positioned chip and substrate assembly is then typically run through a multi-zone oven with individual heat controls that permit a heating profile appropriate for the specific solder. During reflow, the flux in the underfill reduces oxides present on the solder or the metal surface in contact with the solder and allows solder joints to form at the substrate and circuit device pads. Further, within the temperature range of about 60° C. to about 130° C. the thermoplastic resin softens sufficiently to flow and wet the integrated circuit device and substrate surfaces. The assembly is cooled and the solder and underfill harden to form a bonded assembly comprising the integrated circuit device, the substrate, at least one solder joint, and the underfill.

Alternatively, a flip chip bonder that can apply heat and pressure may be employed instead of the reflow oven. In this embodiment, the integrated circuit assembly (flip chip coated with the thermoplastic fluxing underfill) is placed in contact with the conductive pads on the circuit board and heat from the bonder head softens the underfill thereby activating the flux, reflowing the solder bumps, and softens the underfill to bond to the board and chip. The use of a flip chip bonder allows a flip chip to be assembled to a board that already has components mounted thereto. This method may also be used to attach a chip to a site that is being reworked.

Reworking is desirable, for example, if a chip mounting step has failed to properly position the chip on the board. Specifically, the assembly of fine pitch, high-density components can result in misalignments and failed connections. Furthermore, because it is difficult to fully test an unpackaged device such as a flip chip, it is desirable to be able to remove the chip if final testing indicates that the chip is not operating optimally, either through a fault with the chip or as a result of improper mounting. Thermoset underfills do not allow the assembly to be reworked since thermosets cannot be melted once they have crosslinked. The present invention eliminates the problems associated with thermoset underfills by incorporating a thermoplastic resin as the main component of the underfill. Thus, a previously bonded chip may be removed by raising the chip temperature to above the melting point of the solder (approximately 183° C. for tin/lead solder) and above the de-bonding temperature of the underfill resin. Typically, the rework temperature is about 15 to about 25° C. above the solder reflow temperature. Although, the temperature may be higher if localized heat, such as produced with a chip bonder, is used.

Figure 2:
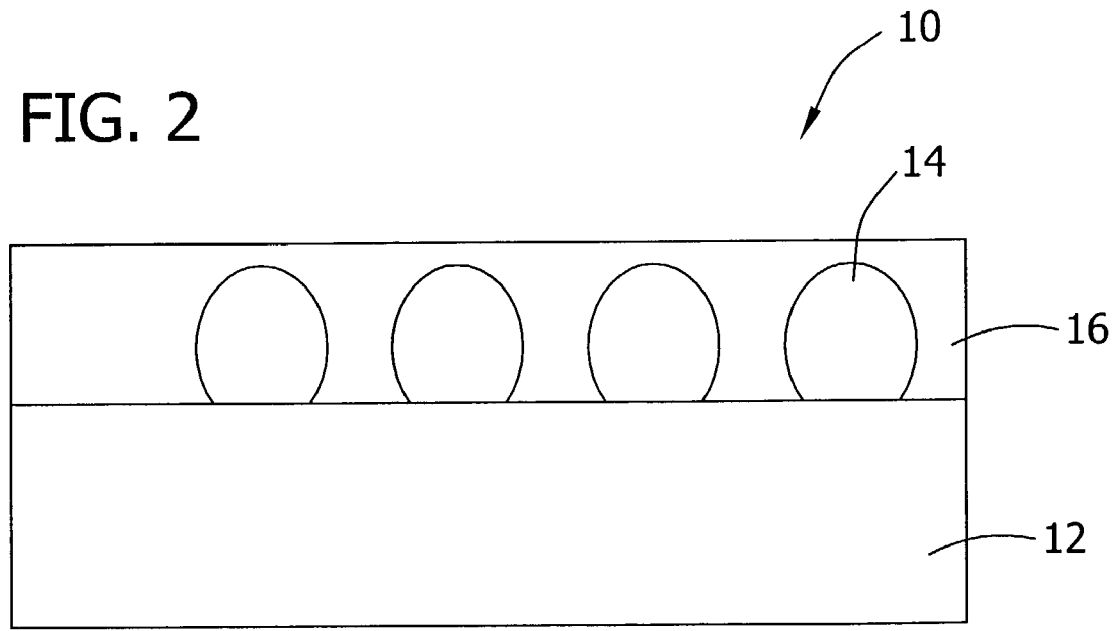
FIG. 2 is a schematic representation of a portion of a semiconductor wafer having solder bumps applied to its surface and a flux/underfill material applied over the solder bumps.

The invention can be further understood with reference to FIGS. 1 and 2. As can be seen schematically in FIG. 1, a semiconductor device 10 comprises a portion of a semiconductor wafer 12 having solder bumps 14 applied to its surface. Subsequently, as represented schematically in FIG. 2, the device 10 has had a flux/underfill material 16 applied to the surface of the wafer 12 having the solder bumps 14. The underfill material 16 occupies at least the spaces between the bumps 14 and also covers the bumps.

With the foregoing method and compositions, a thermoplastic fluxing underfill and an assembly comprising the underfill may be produced. The thermoplastic fluxing underfill of the present invention provides several advantages such as: extended shelf life stability (e.g., greater than six months); provides mechanical shock resistance; delays or prevents device failure do to thermal cycling; reworkability; application to chips eliminates the need to underfill at the end user facility; decreased manufacturing costs; and may be used with lead-containing and lead-free solder.

The following Examples will help to illustrate the invention further.

EXAMPLES

A thermoplastic fluxing underfill containing about 40.00 wt % phenoxy PKCP-80 thermoplastic resin, about 55.90 wt % of ethyl 3-ethoxypropionate solvent, about 1.00 wt % of BYK 306 wetting agent, about 0.10 wt % of SAG 100 defoaming agent, and about 4 wt % DIACID 1550 dicarboxylic acid fluxing agent was prepared according to the following steps. The solvent was placed in a stainless steel beaker and heated to a temperature of about 70° C. while being stirred. Then the thermoplastic resin was added to the solvent in approximately ten percent portions. Specifically, each 10 percent portion was added to the solvent while the stirring was maintained until completely dissolved. At that point, the next ten percent portion was added and mixed. This was repeated until all of the thermoplastic resin was dissolved in the solvent at which time the heating of the solution was discontinued. The BYK 306 and SAG 100 were then added. The solution was allowed to cool to room temperature and the solids content was about 58 percent and the viscosity was about 9,000 cP.

The foregoing thermoplastic underfill solution was cast onto a paper such that the wet film had a thickness of about 0.5 mm. The cast wet film was then dried at a temperature of about 120° C. to evaporate the solvent. The dried film had a thickness of about 0.25 mm. A section of the dried film was cut and placed on the solder bumps of a ball grid array. The solder balls comprised a eutectic tin-lead alloy. The two were placed in an oven maintained at about 165° C. to attach the underfill layer to the flip chip. The underfill coated flip chip was then placed on a printed circuit board and subjected to a reflow operation having a maximum temperature of about 225° C. and a duration of about 90 seconds.

Integrated circuit assemblies comprising the integrated circuit device and the thermoplastic fluxing underfill were then evaluated for resistance to mechanical shock and thermomechanical stress failures. Specifically, the assemblies were tested using a drop shock test which is used to determine resistance to mechanical shock caused by dropping a product containing the assembly. The thermoplastic fluxing underfill improved the drop shock performance of the area array devices by a factor of at least 10 over devices with no underfill. Drop shock performance is a key indicator of the robustness of the device connection to the board. The process involves attaching a 50 g weight to a circuit board with 10 devices and then allowing the weighted board to fall about 2 meters before striking a horizontal surface. A failure is recorded when a device detaches from the board or when the electrical continuity for the device goes to open. Assemblies containing the thermoplastic fluxing underfill were also subjected to a thermal shock reliability test to determine the resistance to stress caused by thermal cycling between −40° C. and 125° C. The thermoplastic fluxing underfill passed this test by undergoing 1000 cycles with less than a 50 percent failure rate.

A second thermoplastic fluxing underfill solution was prepared with a low molecular weight diluent thermoplastic resin to reduce the overall Tg and Tm of the thermoplastic resin component of the underfill to evaluate the applicability of the underfill for devices which require relatively low viscosity for collapse at typical or relatively low reflow temperatures. The formulation comprised about 28 weight percent of PKCP-80, about 8 weight percent of ethoxylated bisphenol A thermoplastic resin (Aldrich Chemical), about 62 weight percent of cyclohexanone, about 2.5 weight percent of DIACID 1550, and about 1 weight percent BYK 306. The constituents were placed in an eight ounce polypropylene jar that was rolled at about 100 rpm for about 2 days on a ball mill roller. Because this manufacturing process is a closed system and uses no heat, the process reduces or eliminates the evaporation of solvent during the incorporation process. Advantageously, because evaporation is greatly reduced or eliminated, this method allows for the preparation of an underfill solution in a consistent manner. The material was then dispensed via syringe onto eutectic bumped 10 mm×10 mm Amkor CABGA (daisy chained) devices. The devices with the coating solution were dried for 1 hour at 70° C. then for 1 hour at 165° C. A coating of approximately 85% of the solder ball height was achieved after the deposition and drying process was completed twice.

The coated 10 mm×10 mm devices were then dipped in a commercial flux, placed via hand on an FR4 substrate, and passed through a reflow profile to form interconnect and to melt the pre applied underfill. Drop shock data indicated a significant improvement in device survivability (defined as an electrical open in the daisy chain) to approximately 10 times that of devices without an underfill.

It is to be understood that the above description is intended to be illustrative and not restrictive. Many embodiments will be apparent to those of skill in the art upon reading the above description. The scope of the invention should therefore be determined not with reference to the above description alone, but should be determined with reference to the claims and the full scope of equivalents to which such claims are entitled.

What is claimed is:

1. A method for forming an integrated circuit assembly for attachment to a circuit board by soldering, the method comprising:
   applying an underfill solution comprising a thermoplastic resin having a glass transition temperature that is within the range of about −25° C. to about 60° C., a solvent, and a fluxing agent to an integrated circuit device having at least one solder bump on a surface thereof such that the underfill solution is in contact with the at least one solder bump and with the surface of the integrated circuit device; and
   removing at least a portion of the solvent from the applied underfill solution to thereby yield the integrated circuit assembly for attachment to a circuit board, wherein the integrated circuit assembly comprises the integrated circuit device, the at least one solder bump, and a thermoplastic fluxing underfill in contact with the integrated circuit device surface and in contact with the at least one solder bump.

2. The method of claim 1 wherein the thermoplastic resin has a melt temperature that is between about 50° C. and about 150° C.

3. The method of claim 1 wherein the glass transition temperature is between about −15° C. and about 40° C.

4. The method of claim 3 wherein the thermoplastic resin has a melt temperature that is between about 60° C. and about 150° C.

5. The method of claim 1 wherein the glass transition temperature is between about 20° C. and about 40° C.

6. The method of claim 5 wherein the thermoplastic resin has a melt temperature that is between about 80° C. and about 100° C.

7. The method of claim 1 wherein the glass transition temperature is between about 25° C. and about 35° C.

8. The method of claim 7 wherein the thermoplastic resin has a melt temperature that is between about 85° C. and about 95° C.

9. The method of claim 1 wherein the glass transition temperature is between about −5° C. and about 10° C.

10. The method of claim 9 wherein the thermoplastic resin has a melt temperature that is between about 50° C. and about 65° C.

11. The method of claim 1 wherein the thermoplastic resin has a molecular weight that is between about 30,000 and about 55,000 Daltons.

12. The method of claim 1 wherein the thermoplastic resin has a molecular weight that is between about 30,000 and about 40,000 Daltons.

13. The method of claim 1 wherein the thermoplastic resin has a viscosity that is less than about 30,000 cP at a temperature that is between about 220° C. and about 260° C.

14. The method of claim 1 wherein the thermoplastic resin has a viscosity that is between about 10,000 and about 1,000 cP at a temperature that is between about 220° C. and about 260° C.

15. The method of claim 1 wherein the thermoplastic resin is a phenoxy resin having about 20 weight percent of caprolactone grafted onto the backbone hydroxyl groups that has a molecular weight of about 39,000 Daltons, a glass transition temperature of about 30° C., and a viscosity that is between about 7,000 and about 2,500 cP at a temperature that is between about 220° C. and about 260° C.

16. The method of claim 1 wherein the solvent is a polar solvent selected from the group consisting of a ketone, an ester, an alcohol, and combinations thereof.

17. The method of claim 1 wherein the solvent is selected from the group consisting of ethyl-ethoxypropionate, methyl ethyl ketone, and cyclohexanone.

18. The method of claim 1 wherein the fluxing agent is selected from the group consisting of a monocarboxylic acid having more than 20 carbon atoms per molecule, and a dicarboxylic acid having more than 12 carbon atoms per molecule.

19. The method of claim 18 wherein the monocarboxylic acid and the dicarboxylic acid are liquid at room temperature and are soluble in a polar solvent.

20. The method of claim 1 wherein the fluxing agent is isostearic acid.

21. The method of claim 1 wherein the underfill solution comprises a concentration of the thermoplastic resin that is between about 20 and about 60 weight percent, a concentration of the solvent that is between about 40 and about 80 weight percent, and a concentration of the fluxing agent that is between about 1 and about 10 height percent.

22. The method of claim 1 wherein the underfill solution comprises a wetting agent.

23. The method of claim 22 wherein the wetting agent is selected from the group consisting of a silane, a fluorocarbon, and an acrylate resin.

24. The method of claim 22 wherein the wetting agent is at a concentration that is between about 0.005 and about 2.0 weight percent of the underfill solution.

25. The method of claim 1 wherein the underfill, solution comprises a defoaming agent.

26. The method of claim 25 wherein the defoaming agent is a polyether modified siloxane, a methylalkyl siloxane, or a combination thereof.

27. The method of claim 25 wherein the defoaming agent is a modified polydimethylsiloxane.

28. The method of claim 25 wherein the defoaming agent is at a concentration that is no greater than about 1 weight percent of the underfill solution.

29. The method of claim 25 wherein the defoaming agent is at a concentration that is between about 0.05 and about 0.5 weight percent of the underfill solution.

30. The method of claim 1 wherein the removing at least a portion of the solvent comprises removing the solvent.

31. The method of claim 1 wherein the removing at least a portion of the solvent comprises drying the applied underfill solution to thereby yield the integrated circuit assembly for attachment to a circuit board, wherein the integrated circuit assembly comprises the integrated circuit device, the at least one solder bump, and a thermoplastic fluxing underfill in contact with the integrated circuit device surface and in contact with the at least one solder bump;

the method further comprising placing the integrated circuit assembly onto the circuit board to yield a circuit board with the integrated circuit assembly placed thereon; and heating the circuit board with the integrated circuit assembly placed thereon to a reflow temperature to thereby solder the integrated circuit device to the circuit board while the fluxing agent fluxes the solder and to flow the thermoplastic fluxing underfill thereby yielding a circuit board having the integrated circuit device attached thereto with a metallic solder connection and the thermoplastic underfill between and bonded to the circuit board and the integrated circuit device.

32. The method of claim 31 wherein the thermoplastic resin has a melt temperature that is between about 50° C. and about 150° C., a molecular weight that is between about 30,000 and about 50,000 Daltons, and a viscosity that is between about 10,000 and about 1,000 cP at a temperature that is between about 220° C. and about 260° C.

33. The method of claim 31 wherein the glass transition temperature is between about −15° C. and about 40° C. and the thermoplastic resin has a melt temperature that is between about 60° C. and about 150° C.

34. The method of claim 31 wherein the glass transition temperature is between about 20° C. and about 40° C. and the thermoplastic resin has a melt temperature that is between about 80° C. and about 100° C.

35. The method of claim 31 wherein the glass transition temperature is between about 25° C. and about 35° C. and the thermoplastic resin has a melt temperature that is between about 85° C. and about 90° C.

36. The method of claim 31 wherein the glass transition temperature is between about −5° C. and about 10° C. and the thermoplastic resin has a melt temperature that is between about 50° C. and about 65° C.

37. The method of claim 31 wherein the solvent is selected from the group consisting of a ketone, an ester, and an alcohol, and the fluxing agent is selected from the group consisting of a monocarboxylic acid having more than 20 carbon atoms per molecule, and a dicarboxylic acid having more than 12 carbon atoms per molecule that are liquid at room temperature and are soluble in the solvent.

38. The method of claim 31 wherein the underfill solution comprises a concentration of the thermoplastic resin that is between about 20 and about 60 weight percent, a concentration of the solvent that is between about 40 and about 80 weight percent, and a concentration of the fluxing agent that is between about 1 and about 10 weight percent.

39. The method of claim 31 wherein the reflow temperature is less than about 300° C.

40. The method of claim 31 wherein the reflow temperature is between about 220° C. and about 260° C.

41. The method of claim 31 wherein the reflow temperature is between about 170° C. and about 225° C.

42. The method of claim 31 wherein the solder is selected from the group consisting of lead-containing solder alloys and lead-free solder alloys.

43. The method of claim 1 wherein the underfill solution comprises a defoaming agent that is a polyether modified siloxane, a methylalkyl siloxane, or a combination thereof at a concentration that is no greater than about 1 weight percent of the underfill solution.

* * * * *